United States Patent
Daubenspeck et al.

(10) Patent No.: US 8,373,275 B2
(45) Date of Patent: Feb. 12, 2013

(54) FINE PITCH SOLDER BUMP STRUCTURE WITH BUILT-IN STRESS BUFFER

(75) Inventors: Timothy H. Daubenspeck, Colchester, VT (US); Jeffrey P. Gambino, Westford, VT (US); Christopher D. Muzzy, Burlington, VT (US); Wolfgang Sauter, Charlotte, VT (US)

(73) Assignee: International Business Machines Corporation, Armonk, NY (US)

(*) Notice: Subject to any disclaimer, the term of this patent is extended or adjusted under 35 U.S.C. 154(b) by 1162 days.

(21) Appl. No.: 12/021,321

(22) Filed: Jan. 29, 2008

(65) Prior Publication Data

US 2009/0189286 A1 Jul. 30, 2009

(51) Int. Cl.
*H01L 23/485* (2006.01)

(52) U.S. Cl. ........ 257/762; 257/760; 257/747; 257/748; 257/737; 257/738; 257/751; 257/E23.021; 438/614

(58) Field of Classification Search .................. 257/762, 257/E23.021, 760, 747, 748, 737, 738, 751; 438/614
See application file for complete search history.

(56) References Cited

U.S. PATENT DOCUMENTS

| | | | |
|---|---|---|---|
| 6,593,220 B1 * | 7/2003 | Yu et al. ........................ 438/612 |
| 6,875,681 B1 | 4/2005 | Bohr | |
| 7,157,204 B2 | 1/2007 | Jung et al. | |
| 2005/0116340 A1 | 6/2005 | Shindo | |
| 2006/0237842 A1 | 10/2006 | Shindo | |
| 2006/0244139 A1 * | 11/2006 | Daubenspeck et al. ....... 257/737 |
| 2011/0095422 A1 * | 4/2011 | Hashimoto .................... 257/737 |

FOREIGN PATENT DOCUMENTS

| JP | 57032621 A | 2/1982 |
|---|---|---|
| JP | 63-88847 A | 4/1988 |
| JP | 63088847 A | 4/1988 |
| JP | 57-32621 A | 2/2002 |

* cited by examiner

*Primary Examiner* — Junghwa M Im
(74) *Attorney, Agent, or Firm* — Scully, Scott, Murphy & Presser, P.C.; Richard M. Kotulak, Esq.

(57) ABSTRACT

A fine pitch solder bump structure with a built-in stress buffer that is utilized in electronic packages, and a method of producing the fine pitch solder bump structure with built-in stress buffer. Employed is a very thick final passivation layer that is constituted of a polyimide as a so-called "cushion" for a minimal thickness of UBM (BLM) pad and solder material, while concurrently completely separating the resultingly produced polyimide islands, so that the polyimide material provides most of the physical height for the "standoff" of a modified C4 (controlled collapse chip connection) structure. In employing the polyimide material as the primary structural component of the vertical chip package interconnect in this particular inventive manner, the inherent stress buffering property of the polyimide material is utilized to full advantage by effectively reducing the high stresses encountered during chip manufacture processing steps, such as chip join, reflow, preconditioning and reliability thermal cycle stressing.

14 Claims, 2 Drawing Sheets

FINE PITCH SOLDER BUMP STRUCTURE WITH BUILT-IN STRESS BUFFER

BACKGROUND OF THE INVENTION

1. Field of the Invention

The present invention relates to the provision of a fine pitch solder bump structure with a built-in stress buffer that is utilized in electronic packages. Furthermore, the invention also relates to method of producing the fine pitch solder bump structure with built-in stress buffer.

2. Discussion of the Prior Art

In the current state-of-the-technology, extremely important difficulties are encountered in connection with the satisfactory obtention of structures of fine pitch Pb-containing and Pb-free solder bump parts, which are employed in FCPBGA packages, wherein the fine pitch may be approximately 150 μm. These packages are subjected to extremely high stress levels during the implementing of semiconductor chip join operations and associated thermal cycling, which frequently causes interconnect reliability problems and the occurrences of electrical openings or disconnects, which adversely affect the functioning and resultant viability of the manufactured electronic packages.

In particular, with the use of brittle Pb-Free C4 materials, the overall chip package interconnect structure is rigid in nature, and does not possess any suitable capability of relieving these stresses other than by cracking of the solder and/or the underlying dielectric materials on the chip side. Thus, any stresses that are encountered are particularly pronounced in the z-direction. Hereby, any stress induced cracking that is observed, for example, through the application of a Sonoscan has given rise to the term "white bumps", which is currently instrumented in gating or essentially restricting the successful qualification of critical fine pitch (150 μm) technology products for key customers employing such products.

SUMMARY OF THE INVENTION

In order to obviate or at least extensively ameliorate the above-mentioned problems which are presently encountered at the extremely high stress levels to which electronic packages of this type are subjected, it is an aspect of the invention to employ a very thick final passivation layer that is constituted of a polyimide as a so-called "cushion" for a minimal thickness of UBM (BLM) pad and solder material, while concurrently completely separating the resultingly produced polyimide islands, so that the polyimide material provides most of the physical height for the "standoff" of a modified C4 (controlled collapse chip connection) structure. In employing the polyimide material as the primary structural component of the vertical chip package interconnect in this particular inventive manner, the inherent stress buffering property of the polyimide material is utilized to full advantage by effectively reducing the high stresses encountered during chip manufacture processing steps, such as chip join, reflow, preconditioning and reliability thermal cycle stressing. Pursuant to a modified embodiment, the polyimide "cushion" effect may be further enhanced, and the UBM, i.e., ball limiting metallurgy (BLM) wiring further protected, by providing coverage through the imposition of an additional layer of polyimide material that is added to the initial polyimide interconnect via subsequent to the UBM (BLM) level processing having been completed.

The foregoing inventive aspects cannot in any manner be ascertained from the current state-of-the-technology, wherein prior art structures of this general type are directed to the formation and employment in electronic packages of thin continuous polyimide passivation film baselayers.

Accordingly, it is an object of the present invention to provide a fine pitch solder bump structure with a built in stress buffer that is employed in electronic packages, the latter of which are potentially subject to relatively high and resultingly unacceptable stress levels.

Another object resides in providing fine pitch solder bump structures with built in stress buffers pursuant to the invention, wherein the stresses that are encountered during chip joining and thermal cycling are resultingly reduced to acceptable levels.

Still another object of the present invention resides in the provision of a method for producing the herein described fine pitch solder bump structures with built-in stress buffers for electronic packages.

BRIEF DESCRIPTION OF THE DRAWINGS

Reference may now be made to the following detailed description of preferred embodiments of the invention, taken in conjunction with the accompanying drawings; in which.

DETAILED DESCRIPTION OF THE INVENTION

Figure 1:
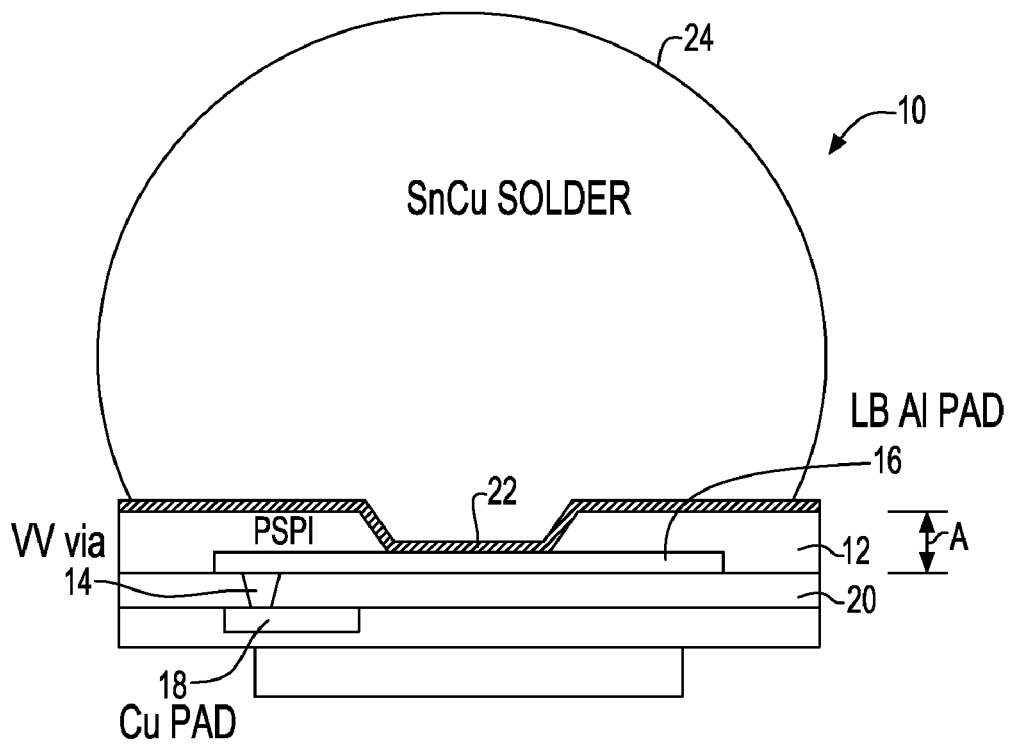
FIG. 1 illustrates, generally diagrammatically, a structure in accordance with the current state-of-the-art, which includes the formation of a thin continuous polyimide passivation film baselayer.

Referring now in detail to the drawings, as diagrammatically represented, wherein FIG. 1 illustrates a typical prior art solder bump structure 10, the latter includes a thin continuous polyimide passivation film baselayer 12 with interconnect via 14 extending between an Al pad 16 and Cu pad 18 in a dielectric substrate 20. The substrate supports a UBM (BLM) connection 22 to a large (75+ μm) diameter sphere or bump of reflowed solder 24, which is preferably constituted of SnCu. The thin polyimide material layer 12 is ~4 μm thick in this prior art structure; i.e., shown to a height of "A". In this type of solder bump construction, any encountered high stresses can readily cause cracking or fracture of the solder of solder bump 24 or the underlying dielectric substrate material 20.

Figure 2:
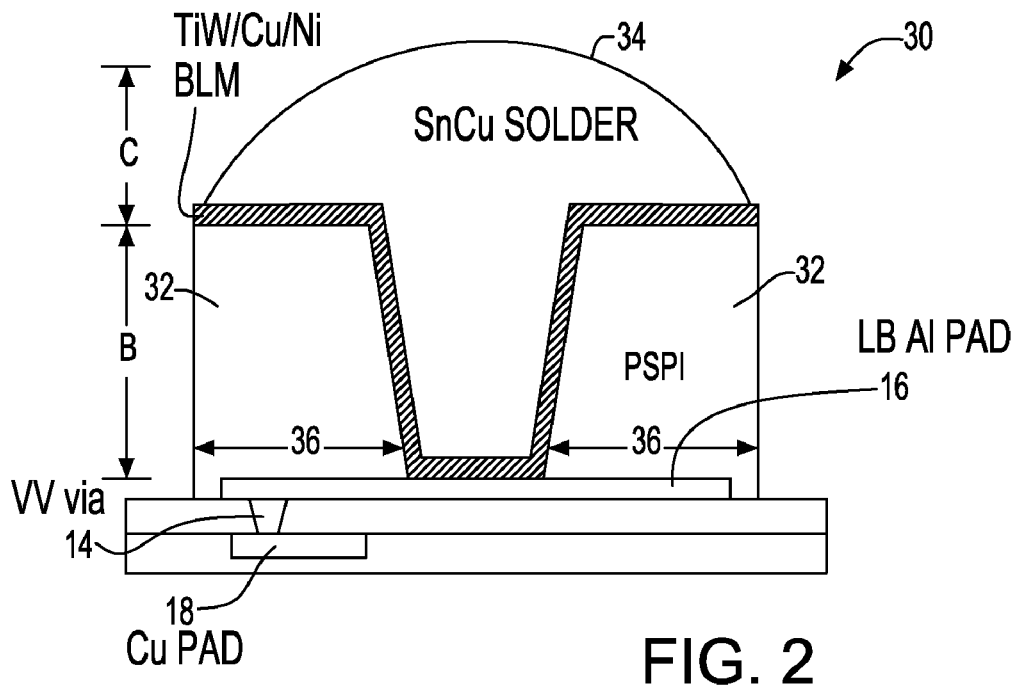
FIG. 2 illustrates, generally diagrammatically, a structure pursuant to a first embodiment of the invention.

Reverting to FIG. 2 of the drawings in which components which are identical with or similar to those shown in FIG. 1 are designated by the same reference numerals, this displays the solder bump structure 30 of a first embodiment of the invention. In this configuration, the polyimide material layer 32 is ~50 μm thick, i.e., possessing a height "B", whereas the solder bump 34 extending thereabove is only ~10-15 μm in height, as shown by "C". The polyimide material layer 32 is segmented into portions 36 such that each C4 structure comprises an independent "island" surrounding the sides of solder bump 34, and is constituted primarily of soft, stress-buffering polyimide material, with the same total "standoff" or overall height that was originally possessed by the prior art solder bump structure 24 of FIG. 1, which in that particular case consists entirely of solder material. The polyimide structure portions 36 are normally separated by $O_2$ ashing, after the C4 processing has been completed, whereby C4 processes suitable for this application include C4 plating or C4NP (C4 New Process) solder transfers.

Figure 3:
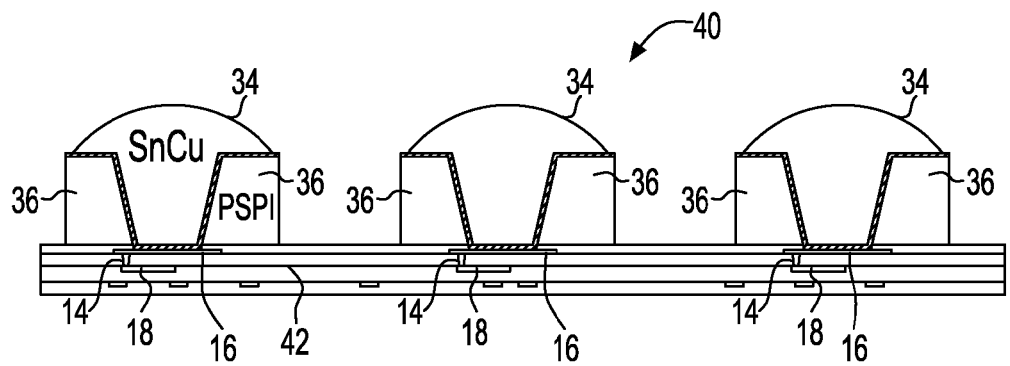
FIG. 3 illustrates, generally diagrammatically, an arrangement of a plurality of the inventive thick polyimide via structures as in FIG. 2.

FIG. 3, in essence, illustrates a structure 40 including a plurality of solder 34 bumps as in FIG. 2, spaced on dielectric substrate layers 42, such as for a semiconductor chip or wafers, with each said solder bump 34 being associated with the vias 14 between the thick polyimide island portions 36, and possessing a minimal lead-free solder bump construction, as shown in the diagrammatic representation thereof.

Figure 4:
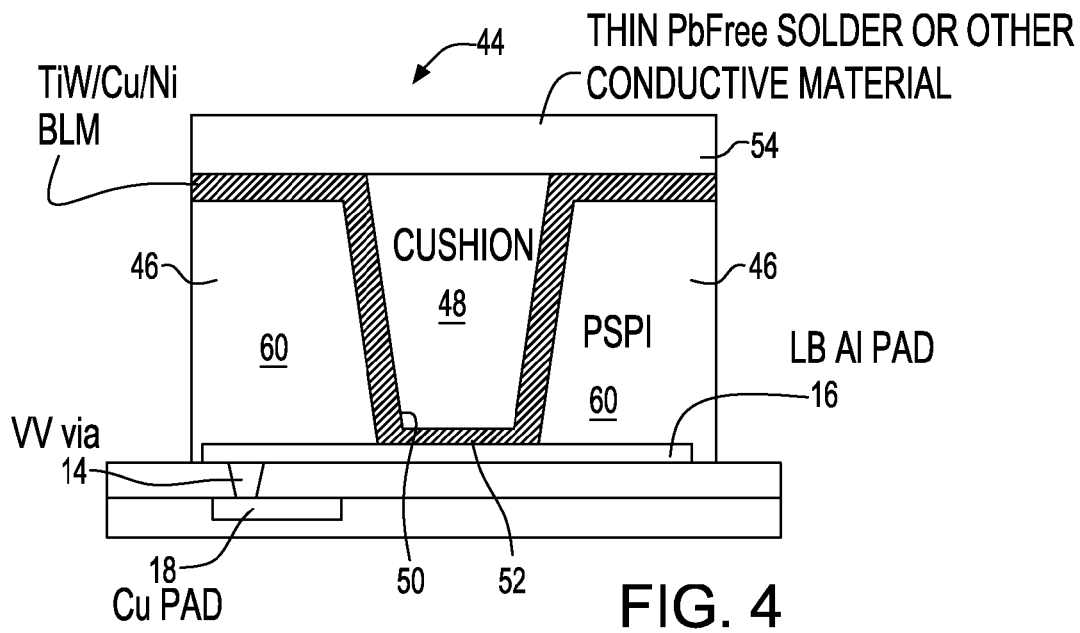
FIG. 4 illustrates, generally diagrammatically, a modified embodiment of the invention, showing a fine pitch C4 connection structure.

FIG. 4 illustrates a somewhat modified embodiment relative to that of FIG. 2 of an inventive fine pitch C4 connection structure 44 with a polyimide material (PI), which may preferably, but not necessarily, be a photosensitive polyimide material (PSPI) cushion 48 for the BLM. Hereby, this embodiment, as diagrammatically represented, provides for an application of a second layer 46 of a polyimide material after the UBM (BLM) processing has been completed, that creates a thick "cushion" of material between the UBM (BLM) wiring 50 within the via 52 and a thin film of solder material 54 that serves as the top plane of the structure 44 for effectuating an electrical contact with the resultant laminate. Hereby, the polyimide "islands" 60 extending about the solder bumps provide the physical "standoff" or, in effect, a height which is required for the chip package interconnect. Moreover, the so-called polyimide "islands" 60 are created when the polyimide material is treated with $O_2$ ashing as one of the final process steps after a solder tip 64 has been formed by C4 plating, or by a physical solder transfer (e.g., such as by C4NP).

Figure 5:
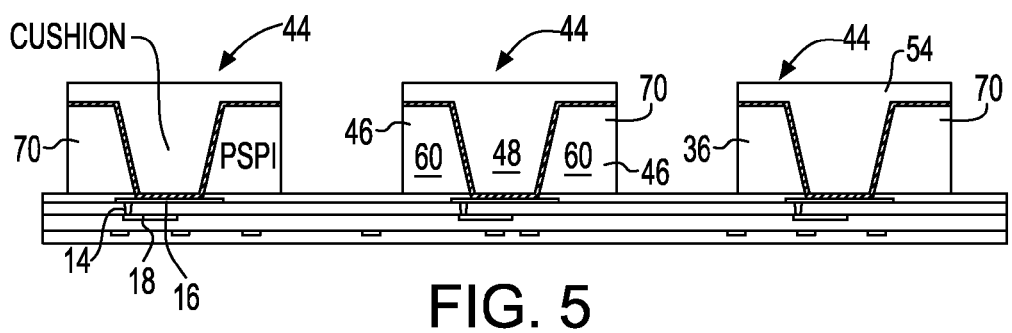
FIG. 5 illustrates, generally diagrammatically, a plurality of fine pitch connection structures of the type shown in the embodiment of FIG. 4.

FIG. 5 illustrates a plurality of fine pitch connection structures 44 with the PI or PSPI cushion-protecting BLMs assembled in a combined array 70, as in the single solder bump representation of FIG. 4 of the drawings, wherein in this drawing figure, the reference numerals for identical components are those employed in FIG. 4.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A fine pitch solder bump structure for semiconductor chip package interconnects, comprising:
   a dielectric substrate having electrical connects arranged therein;
   an electrically conductive pad on said dielectric substrate in communication with said electrical connects, at least one solder bump having an electrically conductive via in electrical contact with said pad;
   a layer of a polyimide material extending about the via of said at least one solder bump, said polyimide material being of a height comprising a major portion of the height of said at least one solder bump; and
   a ball limiting metallurgy (BLM) layer between the layer of the polyimide material and the at least one solder bump, the BLM layer defining a perimeter of a trench filled by the via of the at least one solder bump wherein polyimide islands of the layer of the polyimide material are opposite the trench;
   wherein said layer of polyimide material has a thickness of about 50 μm, and wherein said at least one solder bump has a height extending to about 10-15 μm above the polyimide material layer measured from a top surface of the layer of polyimide material.

2. A solder bump structure as claimed in claim 1, wherein said at least one solder bump and said via are supported on an aluminum pad.

3. A solder bump structure as claimed in claim 2, wherein said aluminum pad is superimposed on an electrically conductive copper pad.

4. A solder bump structure as claimed in claim 1, wherein said at least one solder bump has a diameter of about 75 μm and is constituted of SnCu.

5. A solder bump structure as claimed in claim 1, wherein a plurality of said solder bumps each encompassed by a polyimide material portion are arranged in spaced relationships about said dielectric substrate.

6. A solder bump structure as claimed in claim 5, wherein said solder bumps are spaced within a pitch of about 150 μm relative to each other.

7. A method of producing a fine pitch solder bump structure for semiconductor chip package interconnects, said method comprising:
   providing a dielectric substrate having electrical connects arranged therein;
   arranging an electrically conductive pad on said dielectric substrate in communication with said electrical connects, at least one solder bump having an electrically conductive via in electrical contact with said pad;
   having a layer of a polyimide material extending about the via of said at least one solder bump, said polyimide material being of a height comprising a major portion of the height of said at least one solder bump; and
   positioning a ball limiting metallurgy (BLM) layer between the layer of the polyimide material and the at least one solder bump, the BLM layer defining a perimeter of a trench filled by the via of the at least one solder bump, and the BLM layer defining polyimide islands opposite the trench;
   wherein said layer of polyimide material has a thickness of about 50 μm, and wherein said at least one solder bump has a height extending to about 10-15 μm above the polyimide material layer measured from a top surface of the layer of polyimide material.

8. A method as claimed in claim 7, wherein said at least one solder bump and said via are supported on an aluminum pad.

9. A method as claimed in claim 8, wherein said aluminum pad is superimposed on an electrically conductive copper pad.

10. A method as claimed in claim 7, wherein said at least one solder bump has a diameter of about 75 μm and is constituted of SnCu.

11. A method as claimed in claim 7, wherein a plurality of said solder bumps each encompassed by a polyimide material portion are arranged in spaced relationships about said dielectric substrate.

12. A method as claimed in claim 11, wherein said solder bumps are spaced within a pitch of about 150 μm relative to each other.

13. A method as claimed in claim 11, wherein said polyimide material portions are separated from each other by an $O_2$ ashing process.

14. A fine pitch solder bump structure for semiconductor chip package interconnects, comprising:
   a dielectric substrate having electrical connects arranged therein;

an electrically conductive pad on said dielectric substrate in communication with said electrical connects, at least one solder bump having an electrically conductive via in electrical contact with said pad;

a layer of a polyimide material extending about the via of said at least one solder bump, said polyimide material being of a height comprising a major portion of the height of said at least one solder bump;

a ball limiting metallurgy (BLM) layer between the layer of the polyimide material and the at least one solder bump, the BLM layer defining a perimeter of a trench filled by the via of the at least one solder bump wherein polyimide islands of the layer of the polyimide material are opposite the trench;

wherein said layer of polyimide material has a thickness of about 50 μm, said at least one solder bump and said via are supported on an aluminum pad, said aluminum pad is superimposed on an electrically conductive copper pad; and a second polyimide material layer forming a cushion between wiring located within said via and a superimposed film of a solder material constituting a top plane of the solder bump structure.

* * * * *